United States Patent
Miatto et al.

(10) Patent No.: US 12,141,510 B2
(45) Date of Patent: Nov. 12, 2024

(54) SYSTEM AND METHOD TO DESIGN PHOTONIC CIRCUITS FOR PREPARING GAUSSIAN AND NON-GAUSSIAN STATES

(71) Applicant: XANADU QUANTUM TECHNOLOGIES INC., Toronto (CA)

(72) Inventors: Filippo M. Miatto, Toronto (CA); Nicolas Quesada, Montreal (CA)

(73) Assignee: XANADU QUANTUM TECHNOLOGIES INC., Toronto (CA)

( * ) Notice: Subject to any disclaimer, the term of this patent is extended or adjusted under 35 U.S.C. 154(b) by 575 days.

(21) Appl. No.: 17/512,530

(22) Filed: Oct. 27, 2021

(65) Prior Publication Data
US 2023/0130156 A1    Apr. 27, 2023

(51) Int. Cl.
*G06F 30/32*    (2020.01)
*G06N 10/00*    (2022.01)

(52) U.S. Cl.
CPC .............. *G06F 30/32* (2020.01); *G06N 10/00* (2019.01)

(58) Field of Classification Search
CPC ......... G06F 30/32; G06F 17/11; G06N 10/00; G06N 3/047; G06N 5/01; G06N 7/01
See application file for complete search history.

(56) References Cited

PUBLICATIONS

Yuan Yoa and Filippo M. Matteo, "Fast Differential Evolution of Quantum States under Guassian Transformations", Feb. 10, 2021, arXiv:2102.05742, pp. 1-8. (Year: 2021).*
Miatto et al.; Fast optimization of parametrized quantum optical circuits; arXiv:2004.11002v1 [quant-ph] Apr. 23, 2020.
Miatto et al.; Fast optimization of parametrized quantum optical circuits; arXiv:2004.11002v5 [quant-ph] Nov. 10, 2020.
Tzitrin et al.; Progress towards practical qubit computation using approximate Gottesman-Kitaev-Preskill codes; Phys. Rev. A 101, 032315—Published Mar. 12, 2020 (arXiv:1910.03673v2 [quant-ph] Mar. 16, 2020).

* cited by examiner

*Primary Examiner* — Stacy Whitmore
(74) *Attorney, Agent, or Firm* — Norton Rose Fulbright Canada LLP (57) ABSTRACT

Embodiments described herein provide systems and methods for optimizing a Gaussian representation to design photonic circuits for preparing a given target quantum state. The systems and methods internally consider and optimize quantum representations (e.g., Gaussian transformations, Gaussian and non-Gaussian states). In some embodiments, the systems and methods may produce optimal Gaussian transformations or states. In some embodiments, the systems and methods extract circuit parameters from an optimal Gaussian transformation to produce quantum circuits or designs for generating the optimal states. Embodiments described herein relate to systems and methods for optimizing a Gaussian transformation for state generation.

20 Claims, 3 Drawing Sheets

SYSTEM AND METHOD TO DESIGN PHOTONIC CIRCUITS FOR PREPARING GAUSSIAN AND NON-GAUSSIAN STATES

FIELD

The improvements generally relate to the field of quantum optical hardware, and, more specifically, device discovery and quantum circuit design.

INTRODUCTION

Quantum optical circuits are a class of quantum circuits that utilize quantum states of light as the carriers of quantum information. The states of light may be manipulated by optical transformations performed by one or more programmable circuit elements, such as squeezers, detectors, beam splitters, and so on. For a given application, quantum optical circuit optimization can be inflexible and time consuming. Traditionally, a circuit architecture is chosen prior to optimization. Such an approach may be overly rigid and suboptimal as the architecture may not be optimized for the application at hand. Further, the parameters of each circuit element within the chosen architecture may need to be iteratively optimized individually, which can be time consuming. Accordingly, an improved method and system for quantum optical circuit design is needed.

SUMMARY

In an aspect, embodiments described herein provide a method of optimizing a Gaussian transformation. The method involves initializing a Gaussian transformation on n-modes parametrized by a pair of a symplectic matrix and a displacement vector, and computing an optimal Gaussian transformation. The method involves computing the optimal Gaussian transformation using a processor that, until convergence: evaluates a differentiable cost function that generates a scalar value indicative of quality of the Gaussian transformation; determines a first gradient of the differentiable cost function with respect to the symplectic matrix and a second gradient of the differentiable cost function with respect to the displacement vector; and updates the pair of the symplectic matrix and the displacement vector of the Gaussian transformation by updating the symplectic matrix using the first gradient in a geodesic optimization and updating the displacement vector using the second gradient in a gradient-based optimization. Upon convergence, the method involves extrapolating, from the pair of the symplectic matrix and the displacement vector of the optimal Gaussian transformation, circuit parameters to realize the optimal Gaussian transformation, the circuit parameters being a vector or list of parameter values; and outputting or storing the circuit parameters.

In some embodiments, the method involves computing the optimal Gaussian transformation using the processor by measuring at least a portion of the n-modes of the Gaussian transformation using one or more detectors.

In some embodiments, the differentiable cost function generates the scalar value based on a remaining state of unmeasured n-modes.

In some embodiments, the method involves evaluating the differentiable cost function by comparing the scalar value to a target output to minimize a distance between the scalar value to the target output.

In some embodiments, evaluating the differentiable cost function comprises using automatic differentiation.

In some embodiments, the Gaussian transformation is characterized by a pair (s,d), where s represents the symplectic matrix and d represents the displacement vector.

In some embodiments, the method involves computing an optimal Gaussian state characterized by ($\sigma,\beta$), where $\sigma$ represents a covariance matrix and $\beta$ represents a means vector in phase space.

In some embodiments, the method involves computing a Fock-space representation of the Gaussian transformation using a recurrence method.

In some embodiments, evaluating the differentiable cost function comprises evaluating a Fock-space representation of the Gaussian transformation relative to a target output.

In some embodiments, the method involves backpropagating to update the Gaussian transformation using the first gradient and the second gradient.

In some embodiments, the optimal Gaussian transformation, when measured using one or more detectors, leaves the unmeasured n-modes in a target state.

In some embodiments, the method involves transforming the final circuit parameters into an equivalent circuit that produces an optimal Gaussian state by operating the optimal Gaussian transformation on a vacuum input.

In some embodiments, the method involves generating a circuit that produces an optimal Gaussian state using a Gaussian state input and the optimal Gaussian transformation.

In some embodiments, the method involves computing a circuit that approximates a target state using the final circuit parameters.

In some embodiments, the method involves measuring the at least the portion of the n-modes using a measurement pattern and searching for an optimal measurement pattern for the measurement pattern.

In some embodiments, the method involves including customizations in the measurement comprising at least one of noise, losses and detectors.

In another aspect, embodiments described herein provide an apparatus comprising a hardware processor and a non-transitory memory storing instructions for the hardware processor to: initialize a Gaussian transformation parametrized by a pair of a symplectic matrix and a displacement vector; compute an optimal Gaussian transformation by, until convergence: evaluating a differentiable cost function that generates a scalar value indicative of quality of the Gaussian transformation; determines a first gradient of the differentiable cost function with respect to the symplectic matrix and a second gradient of the differentiable cost function with respect to the displacement vector; updates the pair of the symplectic matrix and the displacement vector of the Gaussian transformation by updating the symplectic matrix using the first gradient in a geodesic optimization and updating the displacement vector using the second gradient in a gradient-based optimization. Upon convergence, the processor outputs or stores the optimal Gaussian transformation.

In some embodiments, the processor extracts circuit parameters from the optimal Gaussian transformation, the circuit parameters being a vector or list of parameter values, and outputs or stores the circuit parameters.

In some embodiments, the processor computes the optimal Gaussian transformation by measuring at least a portion of the n-modes of the Gaussian transformation using one or more detectors.

In some embodiments, the processor evaluates the differentiable cost function using automatic differentiation.

In another aspect, embodiments described herein provide systems and methods to optimize quantum transformations (e.g., Gaussian and non-Gaussian states), and not quantum circuits, for example. In some embodiments, the systems and methods may produce quantum circuits or designs for generating quantum states by extrapolating circuit parameters from the optimized transformation. Embodiments described herein relate to systems and methods for calculating parameters for state generation.

In accordance with an aspect, there is provided a method to design photonic circuits for preparing Gaussian and non-Gaussian states. The method involves: generating a random symplectic matrix representing a random initial Gaussian state on n-modes; computing an optimal Gaussian state by, until convergence to a final symplectic matrix that represents an optimal Gaussian state: computing a Fock-space representation of the Gaussian state; projecting at least a portion of the n-modes onto a measurement pattern; evaluating the state that remains over the remaining n-modes using a differentiable cost function that compares the remaining state to a target state; and update the symplectic matrix using a geodesic optimization on a group of symplectic matrices to obtain a new Gaussian state for the Gaussian state for computing the Fock-space representation. The method involves calculating final circuit parameters as a vector or list of parameter values using the final symplectic matrix; and outputting the final circuit parameters.

In some embodiments, the method involves generating the random symplectic matrix comprises initializing a random pair for a Gaussian transformation G characterized by a pair (s,d), where s represents a symplectic matrix and d represents a displacement vector.

In some embodiments, the method involves computing the optimal Gaussian state until convergence comprises: computing a Gaussian state of output of the pair, the Gaussian state characterized by a covariance matrix and a vector in phase space.

In some embodiments, the method involves computing the Fock-space representation of the Gaussian state comprises using a differentiable recursive process.

In some embodiments, the method involves evaluating the Gaussian state comprises evaluating the Fock-space representation of the Gaussian state relative to a target output using a differentiable cost function.

In some embodiments, the method involves updating the symplectic matrix using the geodesic optimization comprises backpropagation to compute gradients, and using the gradients to update the pair (s,d) by geodesic optimization for looping back to the step of computing the Gaussian state $(\sigma,\beta)$ of the output of the pair.

In some embodiments, the optimal Gaussian state, when measured according to the measurement pattern, leaves the remaining n-modes in the target state.

In some embodiments, the method involves transforming the final symplectic matrix and the displacement vector into an equivalent circuit that produces the optimal Gaussian state starting from a vacuum input.

In some embodiments, the method involves transforming the final symplectic matrix into an equivalent circuit that produces the optimal Gaussian state starting a Gaussian state input.

In some embodiments, the method involves computing a circuit that approximates the target state.

In some embodiments, the method involves searching for an optimal measurement pattern for the measurement pattern.

In some embodiments, the method involves including customizations comprising at least one of noise, losses and detectors.

In accordance with an aspect, there is provided a method to design photonic circuits for preparing Gaussian and non-Gaussian states. The method involves: initializing a random pair for a Gaussian transformation G characterized by a pair (s,d), where s represents a symplectic matrix and d represents a displacement vector; computing an optimal Gaussian state by repeating operations until convergence by: computing a Gaussian state of output of the pair, the Gaussian state characterized by a covariance matrix and a vector in phase space; computing a Fock-space representation of the Gaussian state; evaluating the Fock-space representation of the state relative to a target output using a differentiable cost function; using backpropagation to compute gradients; using the gradients to update s and d in the pair (s,d) by geodesic optimization and a Euclidean method for looping back to the step of computing the Gaussian state of the output of the pair; calculating final circuit parameters as a vector or list of parameter values using the final symplectic matrix; and outputting the final circuit parameters.

In some embodiments, the method involves including customizations comprising at least one of noise, losses and detectors.

In accordance with an aspect, there is provided an apparatus comprising a hardware processor and a non-transitory memory storing instructions for the hardware processor to: generate a random symplectic matrix representing a random initial Gaussian state on n-modes; compute an optimal Gaussian state by, until convergence to a final symplectic matrix: computing a Fock-space representation of the Gaussian state; projecting at least a portion of the n-modes onto a measurement pattern; evaluating the state that remains over the remaining n-modes using a differentiable cost function that compares the remaining state to a target state; updating the symplectic matrix using a geodesic optimization on the symplectic group to obtain a new Gaussian state for the Gaussian state for computing the Fock-space representation; calculating final circuit parameters as a vector or list of parameter values using the final symplectic matrix; and outputting the final circuit parameters.

Many further features and combinations thereof concerning embodiments described herein will appear to those skilled in the art following a reading of the instant disclosure.

DETAILED DESCRIPTION

Systems and methods relate to designing quantum photonic circuits. Embodiments described herein relate to systems and methods for optimizing a Gaussian transformation for a particular application or to meet a design metric from which a set of corresponding circuit parameters may be extracted. For example, a design metric may be a desired state, a desired Gaussian transformation that transforms the vacuum state, a desired covariance matrix. The design metric can be represented as a cost function that returns a scalar value indicative of the quality of a result. The cost function can be minimized to optimize the Gaussian representation. Other example design metrics include optimizing entanglement of the state, error recovery, states that are resilient to errors, success rates of state generation, or transformations that produce a certain number of photons in a mode. Parametrized quantum circuits are information processing devices whose elements depend on one or more circuit parameters.

Optimizing quantum optical circuit parameters can be challenging as the gradient of a cost function needs to be determined with respect to each parameter of each circuit element (or gate) in the circuit. Further, quantum states of interest can be non-Gaussian in nature (i.e. Gottesman-Kitaev-Preskill (GKP) states), which have infinite dimensionality of the photon number vector space (i.e. Fock space representation) that is associated to each optical mode. As a result, an exponential complexity problem arises where the calculation time to convert Gaussian states to and from non-Gaussian representation increases exponentially with the number of modes (i.e. Fock space dimension $n^{number\ of\ modes}$). Truncating the Fock space dimension is required, and the truncation error can lead to inaccurate results.

Embodiments described herein provide systems and methods to design photonic circuits, including, for example, circuits for preparing quantum states with desired properties. In at least one aspect, the methods and systems described herein leverage recurrence methods to convert from phase space to Fock space when needed. Embodiments described herein provide systems and methods for optimizing a Gaussian transformation for a given application, where the application is not limited to generating a particular state. As noted, the circuit (extracted from the Gaussian transformation) could be optimized to increase the success rate of state generation, and so on.

In a further aspect, the methods and systems described herein provide the ability to update a symplectic matrix, which is representative of the operating parameters of a Gaussian quantum optical circuit as a whole, and thereby obviates the need to compute the gradients of the individual gates (i.e. a single "gate" parametrized by some parameters).

In a further aspect, the methods and systems described herein offer design flexibility in that the transformation may be optimized for a given application without having to commit to a specific circuit architecture prior to optimization. Thus, instead of optimizing a selected circuit architecture, which may not be optimized for a given application, the methods and system described herein permit the circuit parameters to be extracted or extrapolated from optimized representations (i.e. Gaussian transformations) such that an optimal architecture may be selected to realize the optimized parameters.

In some embodiments, the systems and methods internally optimize quantum states which may be expressed as a Gaussian transformation acting on a vacuum state, instead of optimizing quantum circuit parameters. In some embodiments, the systems and methods may generate quantum circuit operating parameters from the optimized quantum states.

Figure 1:
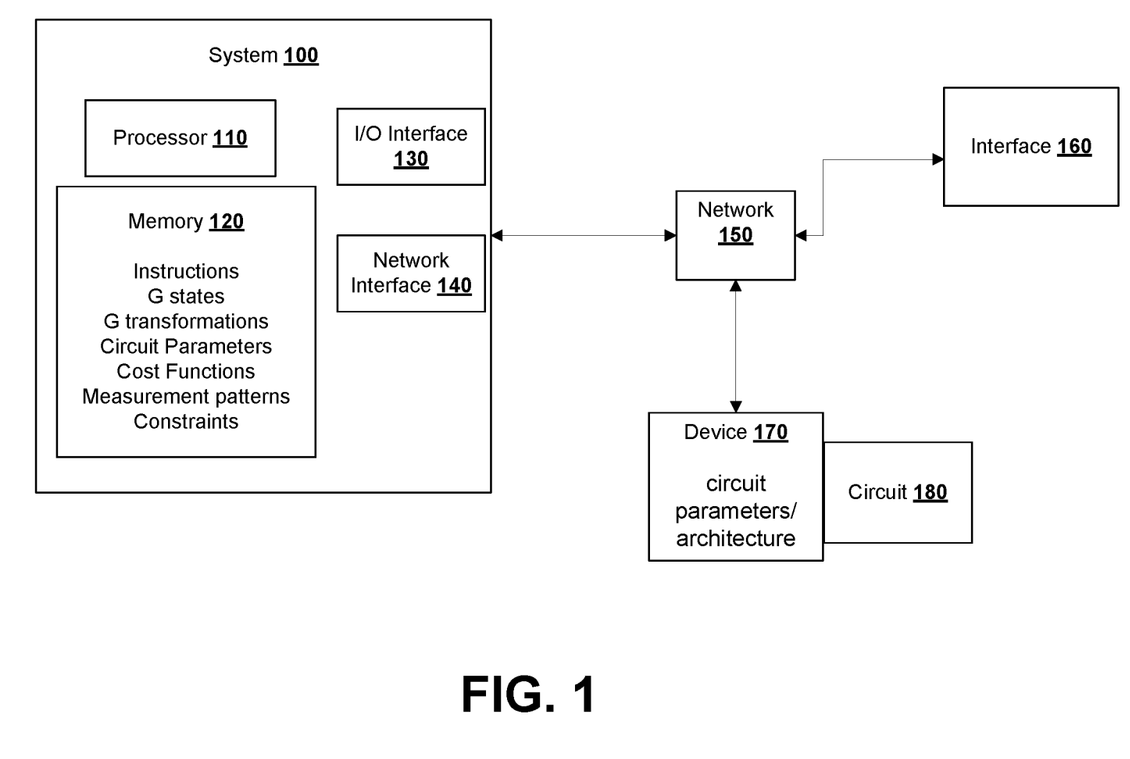
FIG. 1 shows an example system for optimizing Gaussian transformations to design photonic circuits for preparing Gaussian and non-Gaussian states according to some embodiments.

FIG. 1 shows a schematic diagram of an example system 100 to optimize Gaussian representations that can be used for designing quantum optical circuits. The system 100 can design quantum optical circuit parameters from the quantum optical transformations. The system 100 may be configured to carry out the methods described herein to optimize Gaussian transformations for a particular application or to achieve a design metric. In some embodiments, the optimized Gaussian transformations are used to construct circuit architectures.

The system 100 receives input data such as a cost function that embodies different constraints such as an initial Gaussian state, target output, measurement procedure, a given application, design metric, and so on. A number of modes can be set by the state and the transformation. The system 100 can extract circuit parameters from an optimized Gaussian representation. The circuit parameters can be a vector or list of parameter values. The system 100 can compute a Fock representation from a Gaussian representation using recurrence relations. The system 100 determines whether the output Gaussian representation is satisfactory. For example, the system 100 evaluates a differentiable cost function that generates a scalar value indicative of quality of the Gaussian transformation. The system 100 compares the computed Gaussian representation against the target output, a user defined threshold, or otherwise determines convergence using a convergence criterion. The system 100 determines a first gradient of the differentiable cost function with respect to the symplectic matrix and a second gradient of the differentiable cost function with respect to the displacement vector. If the output Gaussian representation is not satisfactory, the system 100 uses symplectic optimization and gradient-based optimization to compute new parameters for the Gaussian representation and loops back to evaluating whether the updated Gaussian representation is satisfactory. For example, the system 100 can update a symplectic matrix using the first gradient in a geodesic optimization, and can update a displacement vector using the second gradient in a gradient-based optimization. Upon convergence, the system 100 extracts circuit parameters from the optimal Gaussian representation and returns the final circuit parameters. As noted, the circuit parameters can be a vector or list of parameter values.

The system 100 comprises hardware components such as a computing device, for example. As depicted, system 100 includes at least one hardware processor 110, memory 120, at least one I/O interface 130, and at least one network interface 140.

Each processor 110 may be, for example, a hardware processor, microprocessor or microcontroller, or combinations thereof. The processor 110 can be a hardware device to run or execute a set of instructions or code stored in the memory 120. The memory 120 may include a suitable combination of any type of computer memory that is located either internally or externally to the system 100 and processor 110. The system 100 can store the circuit parameters extracted from the optimal Gaussian transformation in memory 120. Each I/O interface 130 enables system 100 to receive input data, and interconnect with one or more input devices to receive the input data. Each network interface 140 enables system 100 to communicate with network 150, and other external components, to exchange data with other components, to access and connect to network resources, to serve applications, and perform other computing applications. For example, the system 100 can receive input data from an external interface 160, or transmit output data to the external interface 160. The external interface 160 can provide input data such as initial states, target states, circuit structures, circuit parameters, and so on. The system 100 can transmit output data, such as circuit parameters extracted from an optimal Gaussian transformation, to a hardware device 170, such as a quantum optical device or cloud server. The hardware device 170 can generate an optimal architecture to realize the optimized parameters, and output a quantum optical circuit 180 based on the circuit architecture.

For simplicity only one integrated device is shown but the system 100 may include more computing devices operable to access remote network resources and exchange data. The computing devices may be the same or different types of devices. The computing device has at least one processor 110, a data storage device 120, and at least one communication interface, such as I/O interface 130 or network interface 140. The computing device components may be connected in various ways including directly coupled, indirectly coupled via a network, and distributed over a wide geographic area and connected via a network.

In some embodiments, the processor 110 receives inputs such as: an initial Gaussian transformation parametrized with a symplectic matrix and a displacement vector, a measurement procedure involving Gaussian or non-Gaussian detectors acting on some optical modes, and a cost function that evaluates the state in the remaining modes. The processor 110 minimizes the cost function in a loop, until a convergence criterion is satisfied. In the loop, in some embodiments, the processor 110 computes the Fock representation of the Gaussian state using recurrence methods described herein. Then, the processor 110 uses a geodesic walk on a manifold of symplectic matrices to update the values of the symplectic matrix, and updates the displacement vector using a gradient descent process such as Adam. As noted, the updated pair of the symplectic matrix and the displacement vector characterize an updated internal Gaussian transformation. The processor 110 loops back to evaluate the cost function with the updated Gaussian transformation, and continues the evaluation and update operations until a final Gaussian transformation is determined to be satisfactory. The final symplectic matrix and displacement vector (characterizing the optimized Gaussian transformation) may be used by the processor 110 to extrapolate circuit parameters. The user therefore has the flexibility to choose any suitable circuit architecture that can realize the given Gaussian transformation. The circuit parameter can be extrapolated from the optimized Gaussian transformation and presented via the interface 160 for selection. For example, the interface 160 can present various equivalent circuit parameters to the user for selection to produce the circuit architecture.

The memory 120 stores data for the Gaussian transformation (symplectic matrix, displacement vector pair) or Gaussian state, along with data for parameters, cost functions, and constraints. The memory 120 stores instructions on non-transitory computer readable media for execution by the processor 110 to implement operations described herein.

Figure 2:
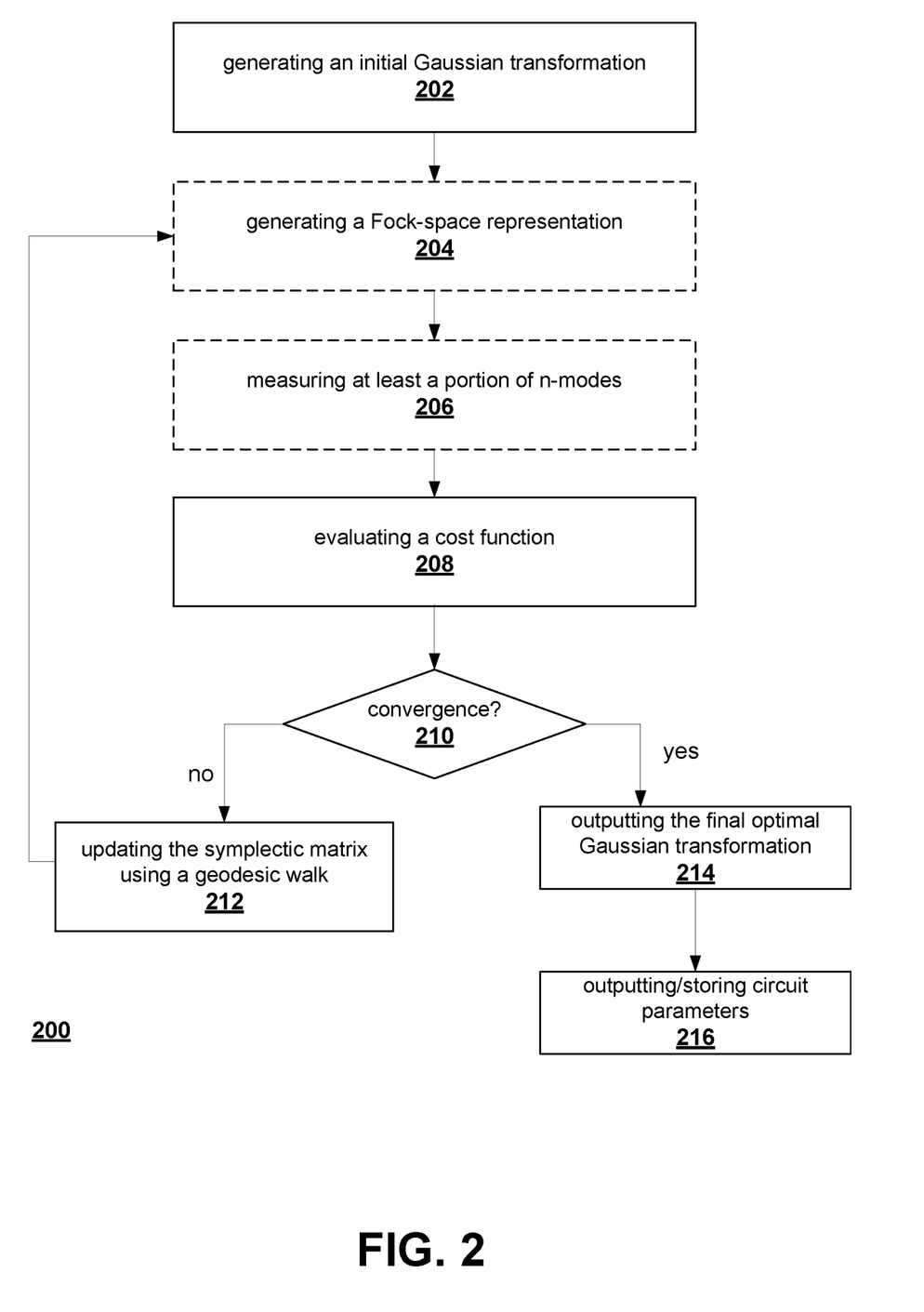
FIG. 2 shows an example method for optimizing Gaussian transformations to design circuit parameters according to some embodiments.

FIG. 2 shows an example method 200 for optimizing a Gaussian transformation for a given application, where the application is not limited to just generating a particular state. The Gaussian transformation can be used for different applications. For example, the Gaussian transformation can be used to design photonic circuits for preparing Gaussian and non-Gaussian states with desired properties. As another example, the circuit (extracted from the Gaussian transformation) could be optimized to increase the success rate of state generation, or to optimize a circuit that produces a certain number of electrons in a mode, and so on. The method 200 can be implemented by components of the system 100. The method 200 can optimize the Gaussian transformation by leveraging the gradient of a differentiable cost function to update symplectic matrices using geodesic optimization. The example method 200 of FIG. 2 is for a noiseless channel.

The method 200 involves using the processor 110 for executing different operations to determine the optimal Gaussian transformation. The system 100 can receive input data from the I/O interface 130 or the external interface 160 in some embodiments. For example, input data can be bounds or constraints on the parameters of the Gaussian state, such as characteristics of the measurement devices.

The system 100 can output circuit parameters extracted from the computed optimal Gaussian transformation or state to the hardware device 170 to develop a quantum circuit 180 or circuit architecture design, for example. Optimization of circuit elements is complex. Instead of circuit optimization, the method 200 focuses on optimization of the Gaussian transformation, which can be converted into an appropriate circuit at a later stage.

At 202, the processor 110 generates an initial Gaussian transformation G characterized by a pair (s,d) where s represents a symplectic matrix and d represents a displacement vector. For example, the processor 110 can generate a random symplectic matrix representing a random initial Gaussian transformation on n-modes. The initial displacement can be a zero vector or a random vector, for example. In some embodiments, the processor 110 initializes a random pair (s,d) with randomized values.

A Gaussian state can be characterized by a (Wigner) covariance matrix and a vector of photon number means (or a means vector). For example, the Gaussian state $\Psi$ can be characterized by the pair $(\sigma,\beta)$, where $\sigma$ represents a covariance matrix and $\beta$ represents the means vector in the phase space quadrature. In some embodiments, the means vector can be represented as mu $\mu$ depending on the coordinates used. It should be noted that although both Gaussian states and Gaussian transformations are described by a matrix and a vector, they have distinct meanings.

The symplectic matrix can represent the Gaussian transformation that an optimized circuit may perform upon a vacuum state in order to produce the Gaussian state. The symplectic matrix and displacement vector can represent how to transform a vacuum state into a Gaussian state, thereby indirectly representing the Gaussian state.

As an illustrative example, a Gaussian transformation G that transforms Gaussian states into new Gaussian states may be written as:

$$(\sigma, \beta) \xrightarrow{G} (s\sigma s^T, s\beta + d)$$

where $(\sigma,\beta)$ is the Gaussian state before G and $(s\sigma s^T, s\beta+d)$ is the Gaussian state after G.

In some embodiments, the method 200 can also work with a Gaussian state input rather than the vacuum input by including an additional transformation on the symplectic matrix.

The vacuum state is a Gaussian state with its covariance matrix being the identity matrix and its means vector being the zero vector: $(\mathbb{1}, \vec{0})$.

Any pure Gaussian state can be thought of as the vacuum state on which the Gaussian transformation is applied:

$$(\mathbb{1}, \vec{0}) \xrightarrow{G} (s\mathbb{1}s^T, s\vec{0}+d) = (ss^T, d)$$

The example method 200 optimizes the Gaussian transformation. The method 200 applies to quantum circuits as they implement a Gaussian transformation on the vacuum state.

As noted, to design and generate a quantum circuit 180 that implements a desired Gaussian transformation, in some embodiments, the method 200 can start at 202 by initializing a random pair $(s_0, d_0)$ and compute the Gaussian state $(s_0 s_0^T, d_0) = \Psi_0$.

In some embodiments, there may be non-Gaussian measurements and a Fock-space conversion may be required. Quantum states of interest can be non-Gaussian in nature. The method 200 can convert to and from phase space and Fock space when needed. In such embodiments, at 204, the processor 110 computes and generates a Fock-space representation of the Gaussian state using a differentiable recursive method.

As an example, the Fock space representation for a 4-mode Gaussian state may be written as:

$$(\sigma, \beta) \rightarrow \sum_{n_1 n_2 n_3 n_4}^{\infty} C_{n_1 n_2 n_3 n_4} |n_1 n_2 n_3 n_4\rangle$$

A cut-off is applied so that the Fock-space representation best approximates the Gaussian state. The tensor C in the above equation is the Fock space representation.

The method 200 uses a recurrence relation to compute $\Psi_0^{Fock}$, which is the Fock representation of the Gaussian state $\Psi_0$. The recurrence relation process computes the Fock representation of the Gaussian state at step n, which can be represented as $\Psi_n^{Fock}$, to interact directly with the state.

In some example embodiments, the method 200 can also compute the Fock representation of Gaussian transformation $G^{Fock}$. For example, there may be non-Gaussian transformations in phase space, or the transformations may be applied to non-Gaussian states.

The Fock-space conversion can involve converting the Gaussian state $(\sigma, \beta)$ to three scalars (A, B, C) where A is a matrix, B is a vector, and C (the vacuum amplitude) is a scalar. Then a recurrence relation (which uses A and B) is applied to repeatedly (and automatically) generate all of the other amplitudes in the tensor that describes the Fock space representation.

Accordingly, the method 200 computes three Gaussian parameter quantities (A, B, C) from a Gaussian state. As an illustrative example, for this recurrence relation, the method 200 can first compute three quantities (A, B, C) from beta $\Psi_n$:

$(s_n, d_n) \rightarrow (A_n, B_n, C_n)$, where $A_n$ is a matrix, $B_n$ is a vector, and $C_n$ is a scalar. A and B are used in the recurrence relation:

$$\Psi_{\underline{k}+1_i}^{Fock} = \frac{1}{\sqrt{k_i + 1}} \left( B_i \Psi_{\underline{k}}^{Fock} + \sum_{p=1}^{N} \sqrt{k_i} A_{ip} \Psi_{\underline{k}-1_p}^{Fock} \right)$$

where $\underline{k}$ is the vector of indices of the array $\Psi^{Fock}$ and N is the number of modes.

The scalar C can be used as the "seed" to initialize and start off the recurrence relation in the above equation:

$$\Psi_{\underline{0}}^{Fock} = C$$

The following provides an illustrative example of how the tensor, matrix, and vector labelled A, B, C can be calculated according to some embodiments:

Input:
Gaussian state: $(\sigma, \beta)$
where $\sigma$ represents covariance matrix and $\mu$ represents the means vector in phase space
Auxiliary matrices:

$$\mathbb{R} := \begin{pmatrix} \mathbb{1} & i\mathbb{1} \\ \mathbb{1} & -i\mathbb{1} \end{pmatrix} \quad X\mathbb{X} := \begin{pmatrix} 0 & \mathbb{1} \\ \mathbb{1} & 0 \end{pmatrix}$$

Change of basis:

$$\tau = \mathbb{R}\sigma\mathbb{R}^+ + \frac{1}{2}\mathbb{1}$$

$$\beta = \mathbb{R}\mu$$

If the state is mixed:

$$A = \mathbb{X}(\mathbb{1} - \tau^{-1})$$

$$B = (\tau^{-1})^T \beta^*$$

$$C = \frac{e^{-\frac{1}{2}\beta^+ \tau^{-1} \beta}}{\sqrt{\det(\tau)}}$$

If the state is pure:
A=top left quadrant of $\mathbb{X}(\mathbb{1} - \tau^{-1})$
B=top half of $(\tau^{-1})^T \beta^*$ $$C = \frac{e^{-\frac{1}{2}\beta^+ \tau^{-1} \beta}}{\sqrt{\det(\tau)}}$$

In some embodiments, the design metric is Gaussian in nature so there may only be Gaussian measurements such that the Fock-space conversion at 204 is not needed. If the design metric requires a Fock representation then the Fock-space conversion can be used.

In some embodiments, at 206, the processor 110 measures at least of portion of the n-modes of the Gaussian representation using one or more detectors. For example, the processor 110 projects some of the optical modes of the Gaussian representation onto a measurement procedure, process, or pattern which is application-dependent. The measurement pattern can specify the number of photons for a given mode. The measurement procedure can involve Gaussian or non-Gaussian detectors acting on some optical modes. In some embodiments, the measurement step can be assumed to be carried out by ideal detectors, (i.e. those with 100% quantum efficiency and zero dark count rate). Non-ideal detectors can be implemented by a noisy channel followed by an ideal detector. As will be described in relation to FIG. 3, detector imperfections can be incorporated by adding noise prior to the measurement. However, the noisy channel is not always needed depending on the application.

The measurement pattern effectively fixes the state of the specified modes (i.e. the measurement of a quantum state collapses the wave function), such that only the unmeasured modes are remaining. The unmeasured modes then represent the final state.

Any number of modes can be measured (including zero) depending on the application. In some cases, including measurements (even Gaussian) is needed to achieve the design metric. For example, for non-Gaussian state preparation, a number of modes can be measured by a non-Gaussian detector. The memory 120 stores different measurement patterns. In some embodiments, the processor 110 can optionally search memory 120 for which measurement pattern is best by trying all patterns, in parallel when possible, up to a given bound. The best measurement pattern generates the best metric or output value.

At 208, the processor 110 evaluates a differentiable cost function using automatic differentiation to generate a real scalar value (and a gradient with respect to the symplectic matrix and displacement vector) indicative of how well the Gaussian transformation achieves the desired designed metric. For example, for state preparation goals, a differentiable cost function that generates a real scalar value indicative of how well the remaining state in the unmeasured modes generated by the Gaussian transformation achieves the desired designed metric. The evaluation can be a comparison to a target state, the value of a property of the state, or other methods of evaluation. The scalar value can then be minimized or maximized depending on the specific application by utilizing its gradient with respect to the symplectic matrix and displacement vector pair (s, d) in each optimization step. The processor 110 determines a first gradient of the differentiable cost function with respect to the symplectic matrix and a second gradient of the differentiable cost function with respect to the displacement vector. Backpropagation can be the process used to compute the gradient. The gradient can then be used to update the transformation.

In some embodiments, at 208, the method computes a cost function c with a single real number generated as output, evaluating how far the Gaussian state at step n is from a target output:

$$c(\Psi_n^{Fock}, \Psi_{target}) \in \mathbb{R},$$

where $\Psi_{target}$ is the target output.

There are different ways of computing the difference between the Gaussian state output and the target output depending on a particular application or instance. For example, a way to evaluate the distance between two pure states is the overlap integral. For pure states, this can also be referred to as fidelity. The fidelity does not notice the global phase (which is physically irrelevant). The fidelity can provide an improved difference measure over the Euclidean distance which is sensitive to a spurious global phase. The evaluation can be a generalized version of computing the distance between two vectors, in a higher dimensional space, taking potentially complicated geometries and topologies into consideration.

In this example, the cost function c computes a numerical score (or scalar value) of undesirability for a given circuit output, which can be minimized (or maximized) by the method 200. The score generated by the cost function is application-dependent, which allows the method 200 to be applied to find circuits that satisfy any given criterion that can be expressed as a cost function. The method 200 can use different cost functions for different applications. For example, a cost function that could be used is −F, where F is the fidelity of the output state with respect to a target state.

At 210, the method 200 determines whether there is convergence to a target fidelity or state, a user-defined threshold, or convergence criterion.

If not, at 212, the processor 110 updates the symplectic matrix using the gradient of the cost function with respect to the symplectic matrix in a geodesic walk or optimization on a group or manifold of symplectic matrices. That is, the processor 110 updates the symplectic matrix based on the gradient calculation of the cost function and a learning rate. The processor 110 also updates the displacement vector using the gradient of the cost function with respect to the displacement vector in a gradient descent method. The method 200 uses symplectic and gradient-based optimization to obtain a new pair characterizing a Gaussian representation (e.g. Gaussian transformation, Gaussian state). That is, the processor 110 uses the gradient with respect to the symplectic matrix in the geodesic optimization to update the symplectic matrix and the gradient with respect to the displacement vector in a gradient-based optimization (SGD, Adam, and so on) to update the displacement vector.

A symplectic matrix is a 2n×2n matrix M with real entries that satisfies $M^T\Omega M=\Omega$ where $M^T$ denotes the transpose of M and $\Omega$ is a fixed 2n×2n non-singular skew-symmetric matrix. All possible symplectic matrices form a smooth Riemannian manifold. Any updated symplectic matrix can remain on the manifold of symplectic matrices, and to traverse along the manifold of symplectic matrices, geodesic optimization or geodesic walk may be employed.

Accordingly, the processor 110 may update the symplectic matrix using the geodesic optimization. The result of the geodesic optimization remains a symplectic matrix.

For example, in some embodiments, at 212, the method computes a first gradient with respect to the symplectic matrix and a second gradient with respect to the displacement vector $$\left(\frac{\partial c}{\partial s_n}, \frac{\partial c}{\partial d_n}\right)$$

of the differentiable cost function c to update $s_n$ in $(s_n,d_n)$ to $(s_{n+1}, d_{n+1})$ and updates the symplectic matrix using the technique referred to herein as geodesic optimization on the group or manifold of symplectic matrices to ensure the updated symplectic matrix remains on the manifold. The method 200 back-propagates the results of the geodesic optimization to update the symplectic matrix.

To find $(s_{n+1}, d_{n+1})$ from $(s_n, d_n)$ and the gradients $$\left(\frac{\partial L}{\partial s_n}, \frac{\partial L}{\partial d_n}\right),$$

the method applies the geodesic update formula for $s_n \to s_{n+1}$:

$$s_{n+1}=s_n e^{-\xi \gamma^T} e^{-\xi(\gamma-\gamma^T)}$$

where $\xi$ is a tunable learning rate and $$\gamma = \frac{1}{2}(Z + JZ^T J) \text{ where } Z = s_n \frac{\partial L}{\partial s_n} \text{ and } J = \begin{pmatrix} 0 & \mathbb{1} \\ -\mathbb{1} & 0 \end{pmatrix}.$$

The above equation acts on the symplectic matrix.

The displacement vector d may be updated using a gradient descent method as it does not require any particular attention to non-Euclidean metrics. That is, Geodesic optimization is not used to update $d_n$ to $d_{n+1}$ and instead, any Euclidean method can be used. Accordingly, for $d_n \rightarrow d_{n+1}$, the method uses a gradient descent process, such as Stochastic gradient descent, Adam (derived from Adaptive Moment Estimation), and so on. The learning rate is similar to the learning rate in gradient descent (i.e. it is a "step size"), but whereas in gradient descent, the steps are in a straight line in Euclidean space, the learning rate takes steps along the length of a path on the symplectic manifold. The learning rate can be several orders of magnitude larger than Euclidean learning rates, which reduces the number of steps needed to reach a local optimum.

The method 200 iteratively repeats steps 204, 206, 208, 212 to evaluate the cost function and update the pair (symplectic matrix, displacement vector) until convergence to a final Gaussian transformation G characterized by the final symplectic matrix and the final displacement vector. In other words, the method 200 evaluates a differentiable cost function (e.g. minimizes or maximizes the cost function) in a loop until it is determined, at 210, that the scalar value output by the cost function satisfies a user-defined threshold, target fidelity or convergence criterion.

Upon convergence, the final symplectic matrix generated by the method 200 represents the Gaussian transformation that an optimized circuit may perform upon a vacuum state in order to produce the state that minimizes (or maximizes depending on the application) the given cost function. The final symplectic matrix represents how to transform a vacuum state into an optimal Gaussian state. Accordingly, the final Gaussian transformation indirectly represents an optimal Gaussian state ($\sigma = ss^T, \beta = d$). When measured according to a measurement procedure, the final symplectic matrix leaves the remaining modes in the target state, or as close to it as allowed by any constraints.

Upon convergence, at 214, the processor 110 outputs the final symplectic matrix and the displacement vector representing the optimal Gaussian transformation.

In some embodiments, the symplectic matrix and displacement vector can be used to extract parameters for an equivalent circuit that produces the optimal Gaussian state by operating the Gaussian transformation G on a vacuum state input. At 216, the processor 110 can extract circuit parameters from the optimal Gaussian transformation. The processor 110 can store the circuit parameters in memory 120.

Accordingly, in some embodiments, the method 200 can transform the symplectic matrix s and displacement vector d pair into an equivalent circuit (or circuit design) that produces the Gaussian transformation optimized for the desired cost function (or application), for example, using a decomposition such as the Bloch-Messiah decomposition. The system 100 can transmit the circuit parameters to another device 170 to generate or produce a circuit 180 based on the circuit parameters. In some embodiments, the system 100 can transmit the optimal Gaussian transformation to another device 170 to extract the circuit parameters.

For example, the system 100 can transmit output representing the final symplectic matrix and displacement vector to a device 170 which can generate a circuit 180 (or circuit design) that generates the optimal Gaussian states. The output can indicate an arrangement of circuit elements to generate the optimal Gaussian state.

The method 200 can determine the optimal Gaussian transformation without initially optimizing the circuit design, or without focusing on optimization of the circuit. Given that circuit optimization can be complex and non-unique, the method 200 can efficiently determine a solution (the final symplectic matrix representing the optimal Gaussian state) by focusing on determining the optimal Gaussian transformation. The method does not require input in advance to specify the architecture of the circuit. The method considers optimization of the Gaussian transformation.

Given that the method 200 bypasses the need to optimize a circuit explicitly, the actual circuit design can be deferred to a later stage. The circuit decomposition for a given Gaussian transformation is generally not unique. The method 200 provides flexibility and freedom to select the decomposition that is most hardware-friendly, instead of committing to a specific architecture from the start. The method 200 can efficiently compute a solution for the optimal Gaussian transformation. The method 200 allows for flexibility such as customizing the cost function, setting a maximum allowed squeezing value, enforcing equal squeezing in all modes, running batches of searches in parallel, allowing for different photon number cut-offs on different modes, and targeting states from a set rather than a single target. Examples of customizations include effects such as noise, losses, detector characteristics.

Figure 3:
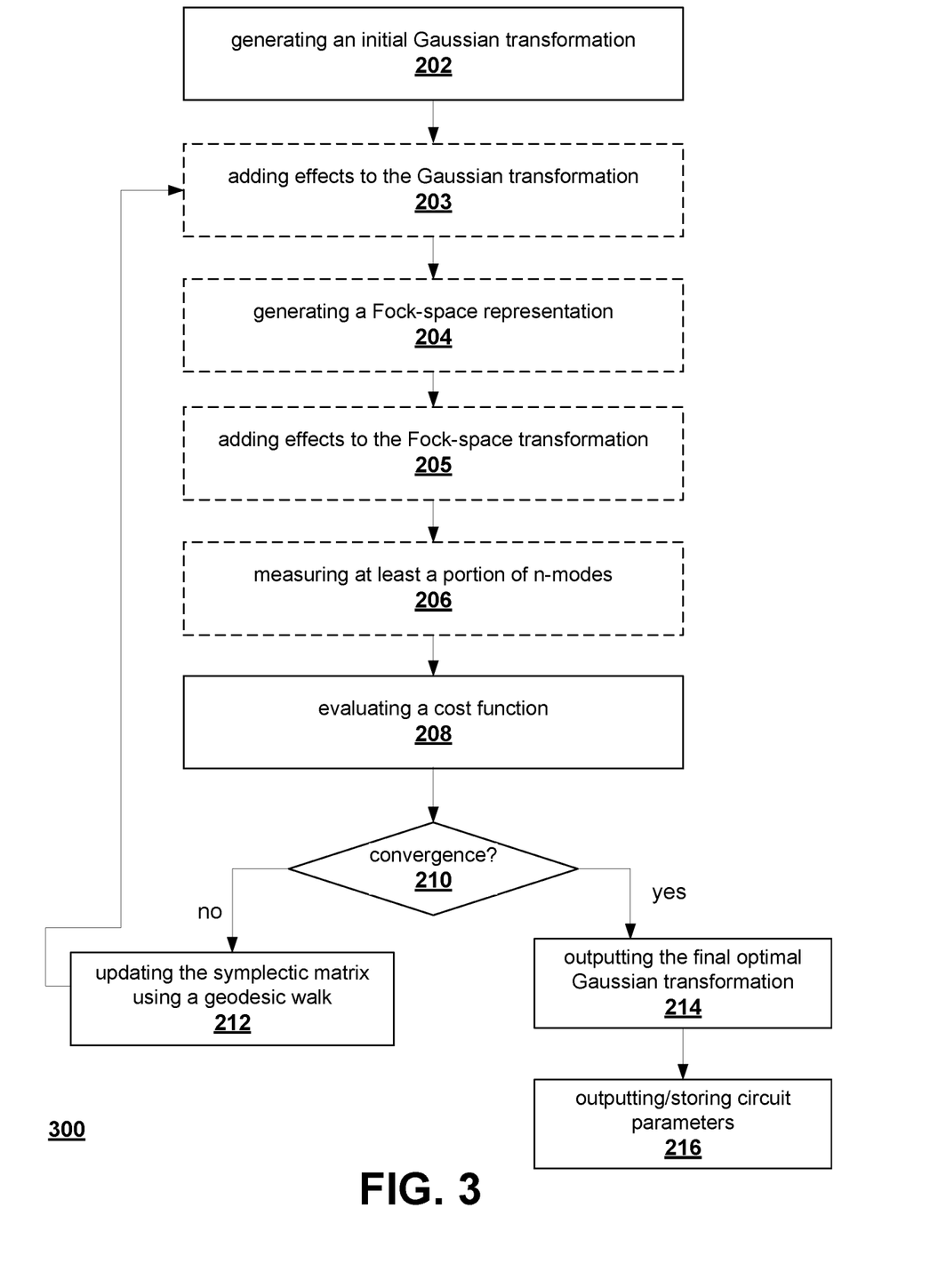
FIG. 3 shows another example method for optimizing Gaussian transformations according to some embodiments.

FIG. 3 shows another example method 300 according to some embodiments. The example method 300 is for a noisy stochastic channel. The method 300 involves similar operations to the method 200 of FIG. 2 as shown by the similar reference numerals.

The example method 300 involves real world effects such as noise and losses, when Gaussian in nature, being added to the Gaussian representation. The real world effects may also simulate realistic detectors.

As shown in FIG. 3, a method 300 for optimizing the Gaussian transformation can involve including potential imperfections to model the hardware. For example, the method 300 can add a noise channel after the Gaussian transformation on either $\Psi_0$ or $\Psi_0^{Fock}$, depending on which is more convenient. Input data can be bounds or constraints on the parameters of the Gaussian state, such as characteristics of the measurement devices or characteristics of added noise.

Accordingly, in some embodiments, at operation 203, real world effects such as noise and losses, when Gaussian in nature, are added to the Gaussian representation through the introduction of a non-zero matrix Y in the Gaussian transformation.

The resulting output can be determined as follows:

$$(\sigma, \mu) \rightarrow x, y, d \rightarrow (x\sigma x^T + y, x\mu + d)$$

As noted, the method 300 can convert from phase space to Fock space when needed. In such embodiments, at 204, the processor 110 computes and generates a Fock-space representation of the Gaussian representation using a differentiable recursive method. In some embodiments that involve a Fock-space conversion, at 205, real world effects such as noise and losses can be added to the Fock-space representation. The method 300 introduces imperfections of the detectors during the Fock conversion at 204 so that ideal detectors can be used during the measurement step at 206. The real-world effects simulate realistic detectors, and optimize the Gaussian transformation for high success rate of the whole procedure (or of parts of it).

The operations, at 205, of adding real-world effects such as noise and losses to the Fock-space representation can be incorporated in the measurement at 206. For example, at operation 205, imperfections of the eventual measurement step, such as those stemming from lossy detectors (detecting fewer photons than there actually are) or dark counts (detecting more photons than there actually are) can be incorporated into the Fock space representation (i.e. tensor) through convolution of the Fock space representation with the stochastic channel (conditional probability distribution) that characterizes the detector.

In some embodiments, for computations that cannot be done on the Gaussian state $(\sigma,\beta)$, at operation 205, processor 110 uses $\Psi^{Fock}$ for the computations, which is the Fock representation of $\Psi$.

Accordingly, the method 300 can process the Fock representation to include imperfections in the measurement. This allows the method 300 to use ideal detectors at the measurement step 206. A photon detector can detect a mode based on the number of photons. A realistic detector can have different effects, such as an under count of photons (e.g. some of the photons are lost) or a dark count of photons (e.g. a photon is detected that does not exist).

This can be considered a convolution, where the convolution kernel is a probability distribution that embodies the imperfections of the detectors.

As noted, at 206, the processor 110 can project some of the optical modes onto a measurement procedure, process, or pattern which is application-dependent. The measurement step can be carried out by ideal detectors since imperfections of the measurement are incorporated in step 205.

Accordingly, embodiments described herein provide a system 100 and methods 200, 300 for optimizing the Gaussian transformation.

An example pipeline of the optimization can be summarized as:

$$(s_n, d_n) \to (A_n, B_n, C_n) \to \Psi_n^{Fock} \to L,$$

$$\left(\frac{\partial L}{\partial s_n}, \frac{\partial L}{\partial d_n}\right) \leftarrow \left(\frac{\partial L}{\partial A_n}, \frac{\partial L}{\partial B_n}, \frac{\partial L}{\partial C_n}\right) \leftarrow \frac{\partial L}{\partial \Psi_n} \leftarrow L,$$

where the above equation describes the back-propagation steps for the gradient of the differential cost function c, and L is the scalar value of the cost function.

An example Gaussian version of the optimization can start directly from the derivative of L with respect to s and d $$\left(\frac{\partial L}{\partial s_n}, \frac{\partial L}{\partial d_n}\right).$$

In such case, there is no need to compute A, B, C, and convert to the Fock space representation.

Embodiments described herein provide a system 100 that implements the steps from $(s_n,d_n)$ to $\Psi_n^{Fock}$ and the back-propagation $$\left(\frac{\partial L}{\partial A_n}, \frac{\partial L}{\partial B_n}, \frac{\partial L}{\partial C_n}\right) \leftarrow \frac{\partial L}{\partial \Psi_n}$$

step as computations by one or more hardware processors 110.

The $\Psi_n^{Fock} \to L$ step is application-specific. The back-propagation steps $$\frac{\partial L}{\partial \Psi_n} \leftarrow L \text{ and } \left(\frac{\partial L}{\partial s_n}, \frac{\partial L}{\partial d_n}\right) \leftarrow \left(\frac{\partial L}{\partial A_n}, \frac{\partial L}{\partial B_n}, \frac{\partial L}{\partial C_n}\right)$$

may be generated automatically by automatic differentiation.

In an example application, the system 100 can calculate the photonic circuit parameters for a circuit processing 3 optical modes.

The indicated photonic circuit of 3 optical modes is fully described by 27 real-valued numerical parameters ($2N^2+3N$ parameters for N modes).

The optimization of the circuit can be employed using a cut-off value for each index. The index can apply to the Fock-space representation and refers to dimensions of an array. In a previous method, increasing the cut-off of the calculation increases the accuracy of the final result as the complete circuit transformation matrix is computed by multiplying the truncated transformation matrices of the individual components, thereby introducing truncation errors (multiplying truncated matrices is not the same as truncating the product of full matrices). With a photon cut-off, circuit parameter calculation using a previous method can require a longer computation time.

By comparison, when using methods according to embodiments for optimizing the circuit parameters described herein, the cut-off number need not be further reduced for circuit optimization. The Gaussian is a full description of a state and thus complete. In this way, not only are the results obtained more accurate due to the lack of truncation errors, but implementation is simplified since the user does not have to be concerned about determining the appropriate additional cut-off required to reach the desired accuracy.

According to embodiments described herein, systems and methods can determine the circuit parameters for an example circuit configuration for processing three optical modes more efficiently and with reduced processing time than known methods. Thus, the speed of obtaining a high quality result was increased by a large factor, of approximately between $10^4$ and $10^5$.

In turn, such significant speedup allows for going beyond the pure state approximation and to optimize the circuit in the presence of noise sources. When noise sources are introduced, the optimization run time for the circuit in the example increases to about a minute, still much faster than the previously known methods, which could not include sources of noise due to long runtimes.

The embodiments of the devices, systems and methods described herein may be implemented in a combination of both hardware and software. These embodiments may be implemented on programmable computers, each computer including at least one processor, a data storage system (including volatile memory or non-volatile memory or other data storage elements or a combination thereof), and at least one communication interface.

Program code is applied to input data and may perform the functions described herein and to generate output information. The output information is applied to one or more output devices. In some embodiments, the communication interface may be a network communication interface. In embodiments in which elements may be combined, the communication interface may be a software communication interface, such as those for inter-process communication. In still other embodiments, there may be a combination of communication interfaces implemented as hardware, software, and combination thereof.

Throughout the foregoing discussion, numerous references will be made regarding servers, services, interfaces, portals, platforms, or other systems formed from computing devices. It should be appreciated that the use of such terms is deemed to represent one or more computing devices having at least one processor configured to execute software instructions stored on a computer readable tangible, non-transitory medium. For example, a server can include one or more computers operating as a web server, database server, or other type of computer server in a manner to fulfill described roles, responsibilities, or functions.

One should appreciate that the systems and methods described herein may optimize usage of resources with improved computations for better memory usage, improved processing, improved bandwidth usage for transmissions of output.

The following discussion provides many example embodiments. Although each embodiment represents a single combination of inventive elements, other examples may include all possible combinations of the disclosed elements. Thus if one embodiment comprises elements A, B, and C, and a second embodiment comprises elements B and D, other remaining combinations of A, B, C, or D, may also be used.

The term "connected" or "coupled to" may include both direct coupling (in which two elements that are coupled to each other contact each other) and indirect coupling (in which at least one additional element is located between the two elements).

The technical solution of embodiments may be in the form of a software product. The software product may be stored in a non-volatile or non-transitory storage medium, which can be a compact disk read-only memory (CD-ROM), a USB flash disk, or a removable hard disk. The software product includes a number of instructions that enable a computer device (personal computer, server, or network device) to execute the methods provided by the embodiments.

The embodiments described herein are implemented by physical computer hardware, including computing devices, servers, receivers, transmitters, processors, memory, displays, and networks. The embodiments described herein provide useful physical machines and particularly configured computer hardware arrangements. The embodiments described herein are directed to electronic machines and methods implemented by electronic machines adapted for processing and transforming electromagnetic signals which represent various types of information. The embodiments described herein pervasively and integrally relate to machines, and their uses; and the embodiments described herein have no meaning or practical applicability outside their use with computer hardware, machines, and various hardware components. Substituting the physical hardware particularly configured to implement various acts for non-physical hardware, using mental steps for example, may substantially affect the way the embodiments work. Such computer hardware limitations are clearly essential elements of the embodiments described herein, and they cannot be omitted or substituted for mental means without having a material effect on the operation and structure of the embodiments described herein. The computer hardware is essential to implement the various embodiments described herein and is not merely used to perform steps expeditiously and in an efficient manner.

Although the embodiments have been described in detail, it should be understood that various changes, substitutions and alterations can be made herein without departing from the scope as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized. Accordingly, the appended claims are intended to include within their scope such processes, machines, manufacture, compositions of matter, means, methods, or steps.

As can be understood, the examples described above and illustrated are intended to be exemplary only. The scope is indicated by the appended claims.

What is claimed is:

1. A method of optimizing a Gaussian transformation, the method comprising:
    initializing a Gaussian transformation on n-modes parametrized by a pair of a symplectic matrix and a displacement vector;
    computing an optimal Gaussian transformation using a processor that, until convergence:
        evaluates a differentiable cost function that generates a scalar value indicative of quality of the Gaussian transformation;
        determines a first gradient of the differentiable cost function with respect to the symplectic matrix and a second gradient of the differentiable cost function with respect to the displacement vector; and
        updates the pair of the symplectic matrix and the displacement vector of the Gaussian transformation by updating the symplectic matrix using the first gradient in a geodesic optimization and updating the displacement vector using the second gradient in a gradient-based optimization;
    upon convergence, extrapolating, from the pair of the symplectic matrix and the displacement vector of the optimal Gaussian transformation, circuit parameters to realize the optimal Gaussian transformation, the circuit parameters being a vector or list of parameter values; and
    outputting or storing the circuit parameters.

2. The method of claim 1, wherein computing the optimal Gaussian transformation using the processor comprises measuring at least a portion of the n-modes of the Gaussian transformation using one or more detectors.

3. The method claim 2, wherein the differentiable cost function generates the scalar value based on a remaining state of unmeasured n-modes.

4. The method of claim 1, wherein evaluating the differentiable cost function comprises comparing the scalar value to a target output to minimize a distance between the scalar value to the target output.

5. The method of claim 1, wherein evaluating the differentiable cost function comprises using automatic differentiation.

6. The method of claim 1, wherein the Gaussian transformation is characterized by a pair (s, d), where s represents the symplectic matrix and d represents the displacement vector.

7. The method of claim 1, further comprising computing an optimal Gaussian state characterized by $(\sigma, \beta)$, where $\sigma$ represents a covariance matrix and $\beta$ represents a means vector in phase space.

8. The method of claim 1, further comprising computing a Fock-space representation of the Gaussian transformation using a recurrence method.

9. The method of claim 1, wherein evaluating the differentiable cost function comprises evaluating a Fock-space representation of the Gaussian transformation relative to a target output.

10. The method of claim 1, further comprising using backpropagation to update the Gaussian transformation using the first gradient and the second gradient.

11. The method of claim 1, wherein the optimal Gaussian transformation, when measured using one or more detectors, leaves the unmeasured n-modes in a target state.

12. The method of claim 1, further comprising transforming the final circuit parameters into an equivalent circuit that produces an optimal Gaussian state by operating the optimal Gaussian transformation on a vacuum input.

13. The method of claim 1, further comprising generating a circuit that produces an optimal Gaussian state using a Gaussian state input and the optimal Gaussian transformation.

14. The method of claim 1, further comprising computing a circuit that approximates a target state using the final circuit parameters.

15. The method of claim 1, further comprising measuring the at least the portion of the n-modes using a measurement pattern and searching for an optimal measurement pattern for the measurement pattern.

16. The method of claim 1, further comprising including customizations in the measurement comprising at least one of noise, losses and detectors.

17. An apparatus comprising a hardware processor and a non-transitory memory storing instructions for the hardware processor to:

initialize a Gaussian transformation parametrized by a pair of a symplectic matrix and a displacement vector;
compute an optimal Gaussian transformation by, until convergence:
evaluating a differentiable cost function that generates a scalar value indicative of quality of the Gaussian transformation;
determines a first gradient of the differentiable cost function with respect to the symplectic matrix and a second gradient of the differentiable cost function with respect to the displacement vector;
updates the pair of the symplectic matrix and the displacement vector of the Gaussian transformation by updating the symplectic matrix using the first gradient in a geodesic optimization and updating the displacement vector using the second gradient in a gradient-based optimization; and
upon convergence, outputs or stores the optimal Gaussian transformation.

18. The apparatus of claim 17, wherein the processor extracts circuit parameters from the optimal Gaussian transformation, the circuit parameters being a vector or list of parameter values, and outputs or stores the circuit parameters.

19. The apparatus of claim 17, wherein the processor computes the optimal Gaussian transformation by measuring at least a portion of the n-modes of the Gaussian transformation using one or more detectors.

20. The apparatus of claim 17, wherein the processor evaluates the differentiable cost function using automatic differentiation.

* * * * *